United States Patent [19]

Pappert

[11] Patent Number: 6,011,734

[45] Date of Patent: Jan. 4, 2000

[54] FUSELESS MEMORY REPAIR SYSTEM AND METHOD OF OPERATION

[75] Inventor: Bernard J. Pappert, Austin, Tex.

[73] Assignee: Motorola, Inc., Schaumburg, Ill.

[21] Appl. No.: 09/038,752

[22] Filed: Mar. 12, 1998

[51] Int. Cl.[7] .............................. G11C 7/00; G11C 29/00
[52] U.S. Cl. ................... 365/200; 365/201; 365/230.03; 365/195; 365/230.08; 371/22.5; 371/10.2; 371/10.3
[58] Field of Search ..................... 365/201, 200, 365/230.03, 195, 230.08; 371/22.5, 10.2, 10.3

[56] References Cited

U.S. PATENT DOCUMENTS

| | | | |
|---|---|---|---|
| 5,058,070 | 10/1991 | Faber et al. | 365/200 |
| 5,245,576 | 9/1993 | Foss et al. | 365/200 |
| 5,325,334 | 6/1994 | Roh et al. | 365/201 |
| 5,748,543 | 5/1998 | Lee et al. | 365/200 |
| 5,764,577 | 6/1998 | Johnston et al. | 365/200 |
| 5,764,655 | 6/1998 | Kirihata et al. | 371/22.5 |

OTHER PUBLICATIONS

Sawada et al., "Built–In Self–Repair Circuit for High–Density ASMIC", IEEE Custom Integrated Circuits Conference, pp. 26.1.1–26.1.4 (1989).

Tanabe et al., "A 30–ns 64 wMb DRAM with Built–in Self–Test and Self–Repair Function," IEEE Journal of Solid–State Circuits, vol. 27, No. 11 (1992).

*Primary Examiner*—Andrew Q. Tran

[57] ABSTRACT

A Built-In Self Test (720) generates a BIST FAIL signal when a failure is detected at a specific address within a memory array (110). The address associated with the failure is stored in a latch (210). During normal operation, the address stored in latch (210) is compared to addresses being currently accesses. A HIT signal is generated when a match occurs. The HIT signal disables selection of the defective row in array (110). A redundant row select signal selects the redundant row (112) to replace the defective row.

19 Claims, 3 Drawing Sheets

FUSELESS MEMORY REPAIR SYSTEM AND METHOD OF OPERATION

FIELD OF THE INVENTION

The present invention relates generally to memory integrated circuit manufacturing, and more particularly to, fuseless repair of integrated memory arrays using redundant memory cells.

COPENDING APPLICATIONS

Copending applications of common assignment exists, having application Ser. No. 08/579,622 and attorney docket number SC90491A.

BACKGROUND OF THE INVENTION

The significance of defects in memory systems is such that considerable effort has been invested to provide repairable arrays using redundant memory array rows, redundant memory array columns, or both. These redundant/spare memory lines (i.e., rows or columns) are not activated for use in the memory array unless post-manufacture testing indicates that a defect exists in the main memory array structure. When a fault is detected in the main memory array structure, a redundant memory array row or column, is substituted for the row or column containing the fault. The final result is that the memory array is fully functional and the fault in the main array is avoided by activating a redundant line to substitute for the faulty memory line (i.e., either row or column). The final yield of a memory system incorporating such redundant structures is greatly improved relative to a memory system in which a single failure results in the whole memory system being scrapped.

Known redundant structures fall into one of two broad types of redundant architectures: (1) cache/tag architectures; and (2) fuse-based architectures.

In a cache/tag based architecture, a small array of memory lines and corresponding address tags are placed on the same chip as the memory array. When defects are discovered during testing, individual cache lines are mapped, via the tags, to replace the faulty memory lines. The mapping is accomplished by storing the address or "tag" of the defective line(s) into the tag associated with one or more of the cached replacement line(s). Subsequent accesses of the faulty main array address use the memory cells in the cached replacement line. Cache/tag architectures are generally complex structures, require significant space to implement, and consume excessive power resulting in reliability issues. In addition, a parallel access to the defective line in main memory occurs, resulting in the dissipation of excess current, especially when the failure mechanism of the line is high current failure related.

One example of such a prior art device having memory built in self repair (MBISR) is a content addressable memory (CAM) used to repair defective rows within the memory array. In this prior art device if an address to the memory array matches an address stored in the CAM, then data is supplied from the CAM instead of the defective row of memory. However in this prior art device the sense amplifier for the defective row in the array continues to function even though the CAM is supplying the data. This dual access can affect reliability by leading to high current drain and electromigration problems. In addition this prior art device degrades the speed at which the array can be accessed because a MUX is required to select between the array and the CAM.

In a fuse-based architecture, a replacement row is selected by blowing a fuse associated with a defective memory row. Once the fuse is blown, the defective address is remapped either: (1) directly to a redundant memory row; or (2) to the next functional memory row in the memory array. In the second case, every other subsequent memory row (which is not defective) is also remapped to the next subsequent memory. This style of redundancy is also known as a "push-down" architecture since a fault is corrected by incrementing all memory row pointers to point to a subsequent (row+1). The last row in the memory array now points to a redundant row in the memory array.

This push down feature is conventionally accomplished using laser hardware to replace, by cutting and connecting, faulty bits with redundant rows or columns. Finding the exact physical location on the silicon wafer or die requires a program to calculation and store the location so that the laser machine can cut and mend the faulty locations with the redundant location. This procedure requires purchasing the laser hardware and substantial test time, effectively increasing overhead.

One prior art device using a push down feature uses built in self repair to repair defective rows within the memory array. However, in this prior art device, once a first defective row is patched, only 50% of any subsequent defective rows can be repaired using a second redundant row. Specifically in this prior art device if defects occur in 2 odd rows or 2 even rows they cannot both be repaired. Thus this prior art device has limited reparability.

Both fuse-based strategies outlined above require a process that supports fuse formation. These processes can be more complex than typical integrated circuit (IC) processes. The fuses are typically formed in a lower conductive layer of material (such as a second level of polysilicon). Therefore, complex etch processing is used to etch through passivation, inter-level dielectrics, nitride layers, etch and polish stop layer, and the like to expose the fuse to laser operations. These etches to form a fuse opening are complex and may adversely affect yield. Further, the process of blowing fuses requires an additional assembly/laser step after test. The process of blowing the fuse with a laser vaporizes the fuse leaving particle residue on the die surface and within fuse openings. This residue is sometimes conductive resulting in electrical short circuits or leakage paths. Also, fused repair must be performed before packaging the die, must be performed in the factory, and can never be undone or used later in the life of the memory system. Therefore, once a fuse is blown, it cannot be "unblown". In addition, once the IC is packaged, the laser repair operation cannot be performed through the IC package and subsequent end-user repair is impossible which adversely affects IC lifetime.

Therefore, a need exists for a memory repair redundancy system which is more versatile and safe than fuse-based repair and more area-efficient and less-complex than cache-based repair.

BRIEF DESCRIPTION OF THE DRAWINGS

The features and advantages of the present invention will be more clearly understood from the following detailed description taken in conjunction with the accompanying figures where like numerals refer to like and corresponding parts and in which.

DETAILED DESCRIPTION OF THE DRAWINGS

A device having Built-In Self Test (BIST) capabilities generates a BIST FAIL signal when a defective row is detected at a specific address of a memory array cells 110. The address associated with the failure is stored in a latch 210. During normal operation, the address of the defective row stored in latch 210 is compared to the address being currently accesses. A HIT/CLOCK DISABLE signal 412 is generated when a match occurs between the defective address and the current address. The HIT/CLOCK DISABLE 412 signal disables selection of the defective row in cells 110. A redundant row select signal alternatively selects the redundant row 112 to replace the defective row. The redundant row may be in any bank of memory associated with a tile of memory. By disabling the defective row and in there place using the redundant row, an advantage over the prior art is gained in that bad row data is not being sensed. This eliminates the possibility of a high current state occurring due to a defective row.

Figure 1:
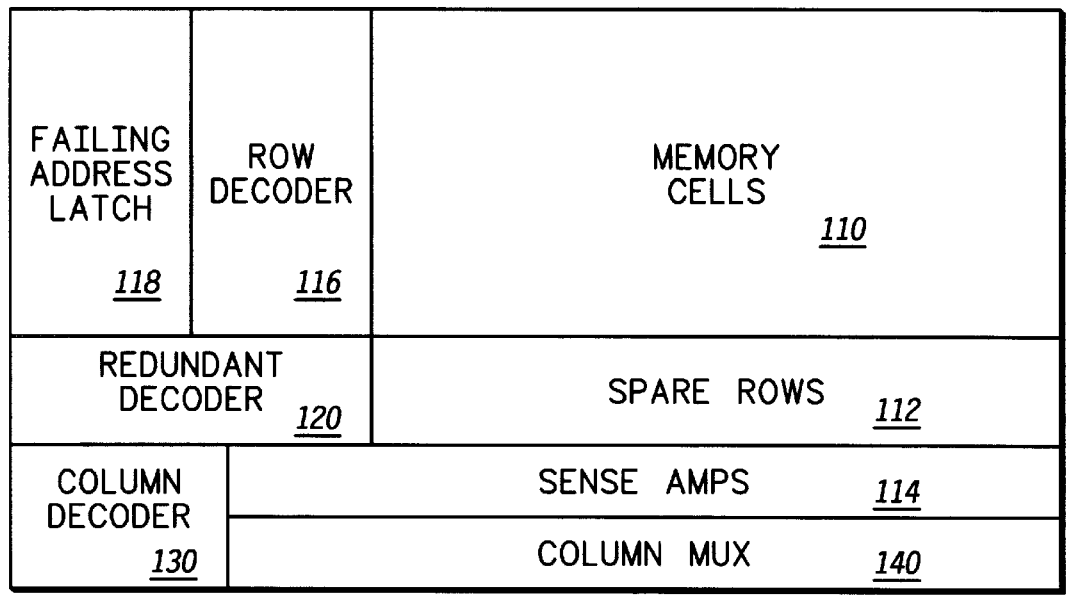
FIG. 1 illustrates a floorplan of a device in accordance with a specific embodiment of the present invention.

Shown in FIG. 1 is a semiconductor device 100 for use with memory Built In Self Repair (BISR) in accordance with one embodiment of the present invention. Semiconductor device 100 comprises a memory cells 110, redundant rows 112, a sense amps 114, row decoders 116, a Latch 118 for storing Built-In Self-Test (BIST) failing addresses, a redundant decoder 120, a column decoder 130, and a column multiplexer (MUX) 140.

In one embodiment, redundant rows 112 comprises two redundant rows. Alternatively, redundant rows 112 may comprise only one redundant row, or many redundant rows. In one embodiment, memory cells 110 comprises volatile memory cells, such as Dynamic Random Access Memory (DRAM) cells and Static Random Access Memory (SRAM) cells. Alternatively, memory cells 110 may comprise non-volatile memory cells such as Electrically Programmable Read Only Memories (EPROMS), as Electrically Erasable Programmable Read Only Memories (EEPROMS), and FLASH EPROMS. Memory cells 110 comprises a plurality of rows which are controlled by row decoder 116. In addition, memory cells 110 comprises a plurality of columns which are sensed by sense amps 114.

After memory cells 110 is powered up, a BIST routine is run on memory cells 110 to identify defective rows within memory cells 110. The addresses of the defective rows are then stored within Latch 118. During normal operation of memory cells 110, redundant decoder 120 is used to determine whether or not one of the redundant rows within redundant rows 112 must be substituted for a defective row within memory cells 110. This selection is accomplished by comparing the failing addresses stored within Latch 118 with the address currently being accessed within memory cells 110. For example, if the within memory cells 110, the address being accessed matches one of the defective addresses stored within Latch 118, then redundant decoder 120 will select a redundant row within redundant rows 112 to replace the defective row within memory cells 110. At the same time, redundant row decoder 120 deactivates the row decode of the defective row within memory cells 110 and row decoder 116. In one embodiment of the invention, redundant decoder 120 generates a disable signal (HIT), which indicates one of the spare rows 112 is currently being accessed. The HIT signal is then used to deactivate the row decoder associated with the defective row within memory cells 110. In one embodiment, Latch 118 comprises latches for storing the failing row addresses and a comparator for comparing the failing row addresses with the addresses currently being accessed within the memory cells 110 during normal operation. It will be discussed in greater detail that redundant row decoder 120 and Latch 118 comprise a BIST re-configurable row decoder.

Figure 2:
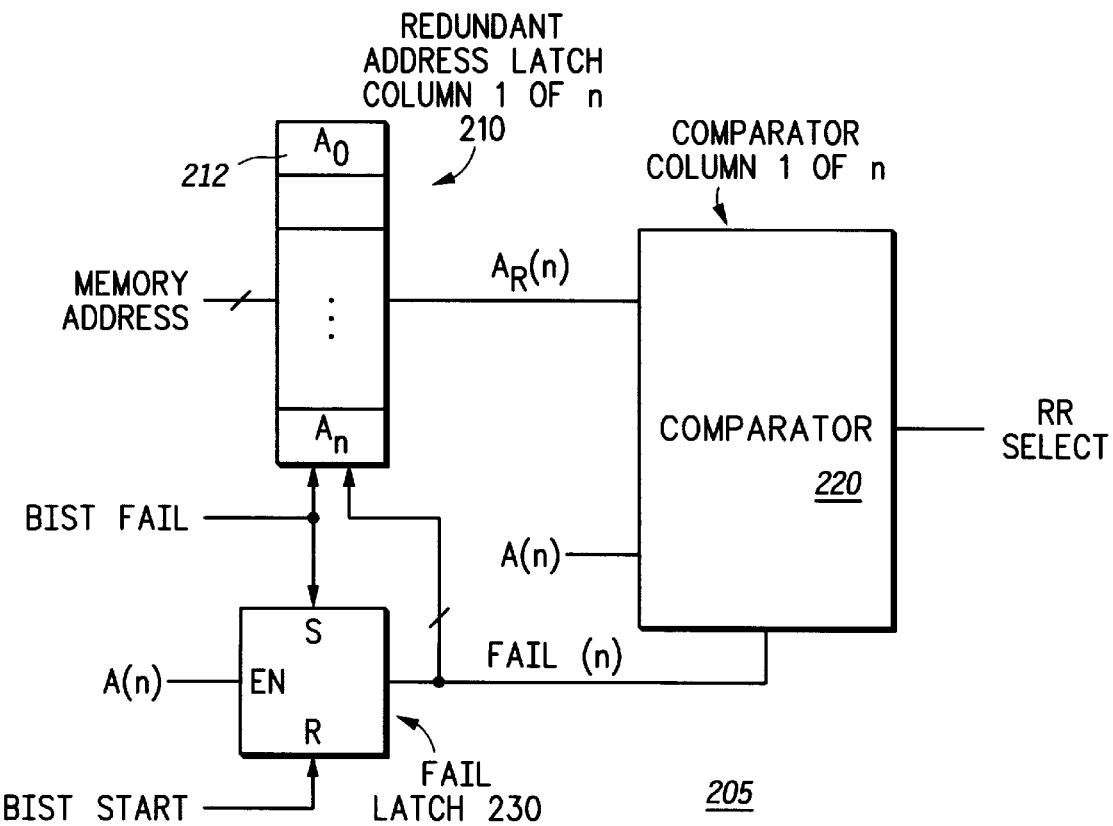
FIG. 2 illustrates a block diagram of a portion of the device of FIG. 1.

FIG. 2 shows a specific embodiment of the present invention. Circuit block diagram 205 represents a portion of Latch 118 and Redundant Decoder 120. Circuit 205 comprises a Redundant Address Latch 210 having bits A(0) through A(n), comparator 220, and a fail latch 230.

The Redundant Address Latch 210 has an input terminal for receiving a Memory Address, a fail(n) input, an enable terminal for receiving the BIST FAIL signal which is for enabling the latch function, and an output terminal for providing a latch value. The comparator 220 has a first input terminal coupled to the output terminal of the Redundant Address Latch 210, a second input terminal for receiving the MEMORY ADDRESS, an enable terminal for enabling the comparator 220, and an output terminal for providing a signal labeled RRSELECT, which when active selects a redundant row. The fail synchronous flip flop 230 has an input terminal for receiving the BIST FAIL signal, a second input terminal for receiving the BIST START signal, and an input terminal for the memory address A(n) used only for selection. The Redundant Address Latch 210 and the Fail Flip Flop 230 are both selected by A(n) and Fail(n).

When a BIST program is initiated, usually at start up, an active BIST START signal is generated causing the Fail Latch 230 to be reset. This reset causes the latch output to be inactive. An inactive output indicates that no bad rows have been identified. When, during BIST operation, a defective row is encountered at the current memory location, which is present on the MEMORY ADDRESS, an active BIST FAIL signal is generated. In response, redundant address latch 210 selected by A(n) and F(n) stores, or latches, the location of the current address which is failing. Specifically, while the BIST program is running the address A(n) of the row being tested within the memory cells 110 is provided to redundant address latch 210. If there is a BIST failure, the location of the defective row address is stored in redundant address latch 210 in response to the BIST FAIL signal going active. Likewise, the FAIL LATCH 230 is also set to indicate that a failed memory address is stored in the Redundant Address Latch 210 and that a compare should subsequently occur during normal operation.

During normal operation, addresses being accessed within memory cells 110 are compared with addresses stored within redundant address latch 210 by comparator 220. If the addresses match, and comparator 220 is enabled by the Fail Latch 230, a row redundancy select signal (RRSELECT) is generated by the comparator 220 to access a redundant row instead of the defective row within memory cells 110.

It should be understood that circuitry 205 needs to exist for each redundant row implemented. In other words, if a design has two redundant rows in a single tile of memory, two circuits similar to 205 would need to exist. In a circuit with multiple memory tiles, there would be multiple versions of circuitry 205. Note that the Fail Latch 230 is used to keep track of which redundant rows are currently being used.

Figure 3:
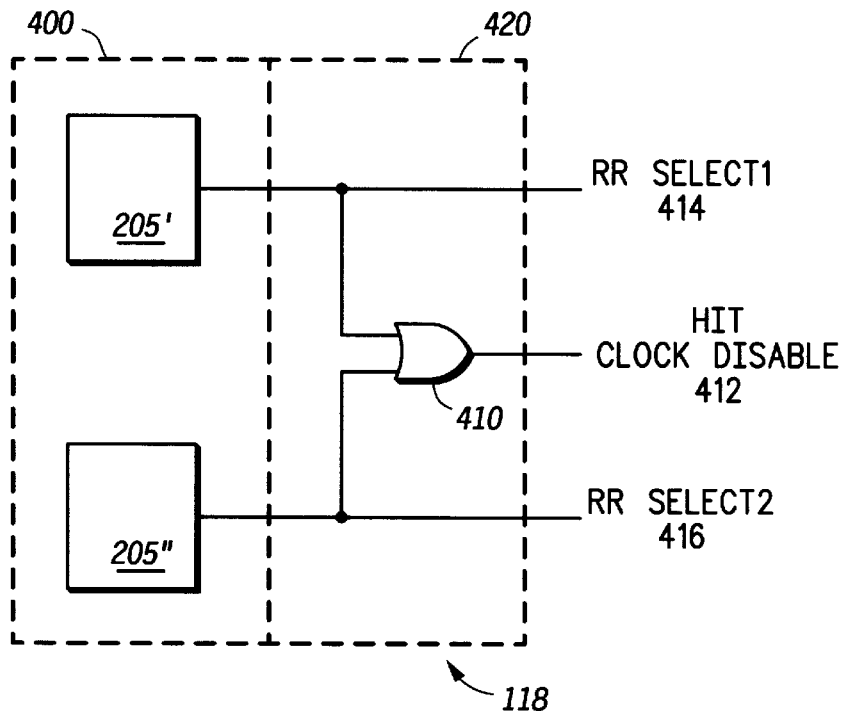
FIG. 3 illustrates a block diagram of a specific implementation of the present invention.

Shown in FIG. 3 is one embodiment of a portion 400 of block 118 and a portion 420 of redundant decoder 120 both of FIG. 1. Block 205' operates in a similar manner to device 205 of FIG. 2 in that it generates a select signal RRSELECT1 414 which is used to select a first redundant row (RROW1) and also input into OR gate 410. Block 205" likewise generates signal RRSELECT2 416 which is used to select a second redundant row (RROW2) and also input into OR gate 410. In response to signals RRSELECT1 and RRSELECT2, OR gate 410 generates a clock disable signal (HIT) 412 which disables all of the row decoders within row decoder 116 when a match, or hit, occurs between addresses A(n) and AR(n). This is best understood in reference to FIG. 4.

Figure 4:
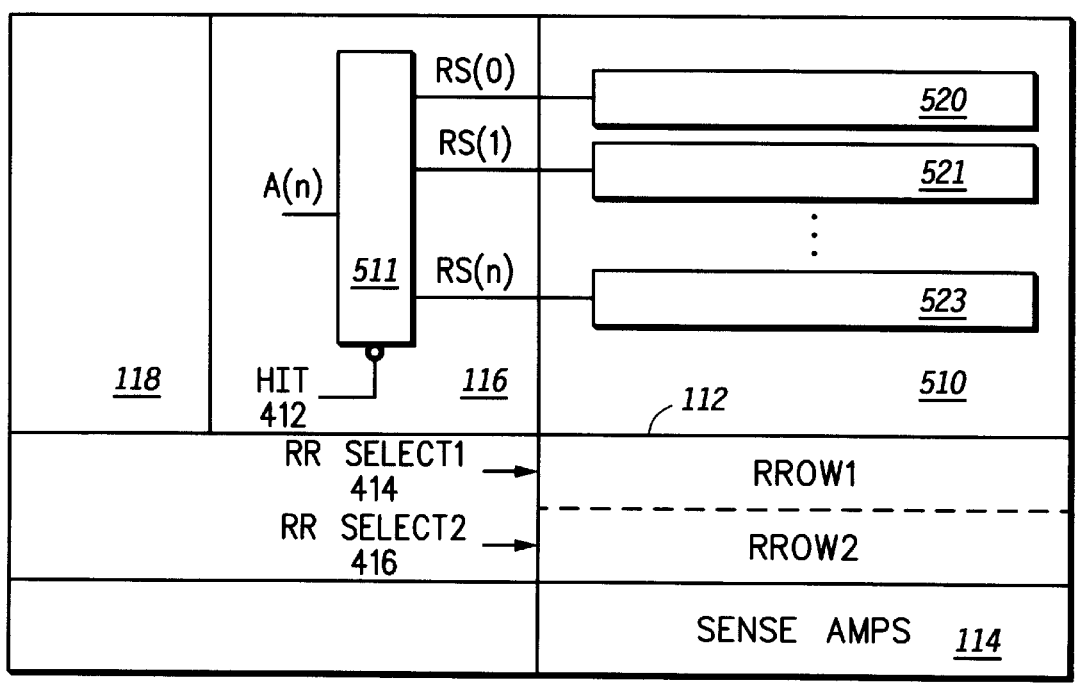
FIG. 4 illustrates the floorplan of FIG. 1 with further block diagram details.

Shown in FIG. 4, RRSELECT1 414 is used to select redundant row RROW1 and likewise RRSELECT2 416 is used to select redundant row RROW2. If a redundant row is selected, then HIT signal 412 disables all row selects associated with memory cells 110. Specifically, in FIG. 4, HIT signal 412 is shown to be disabling row decoder 511 which is coupled to rows 520 through 523 of memory cells 110.

In another embodiment, not shown, the individual rows of the Cells 110 can be disabled by dedicated latches. For example, each output of the decoder 511 could be further qualified by a bit stored in a dedicated latch. The dedicated latch would be reset on startup, and set only when the row with which it is associated generates a failure during BIST. In this manner, the HIT signal would not be generated each time a redundant row is used, and the bad row is disabled faster since there is no delay for the generation of the HIT signal during normal operation.

Figure 5:
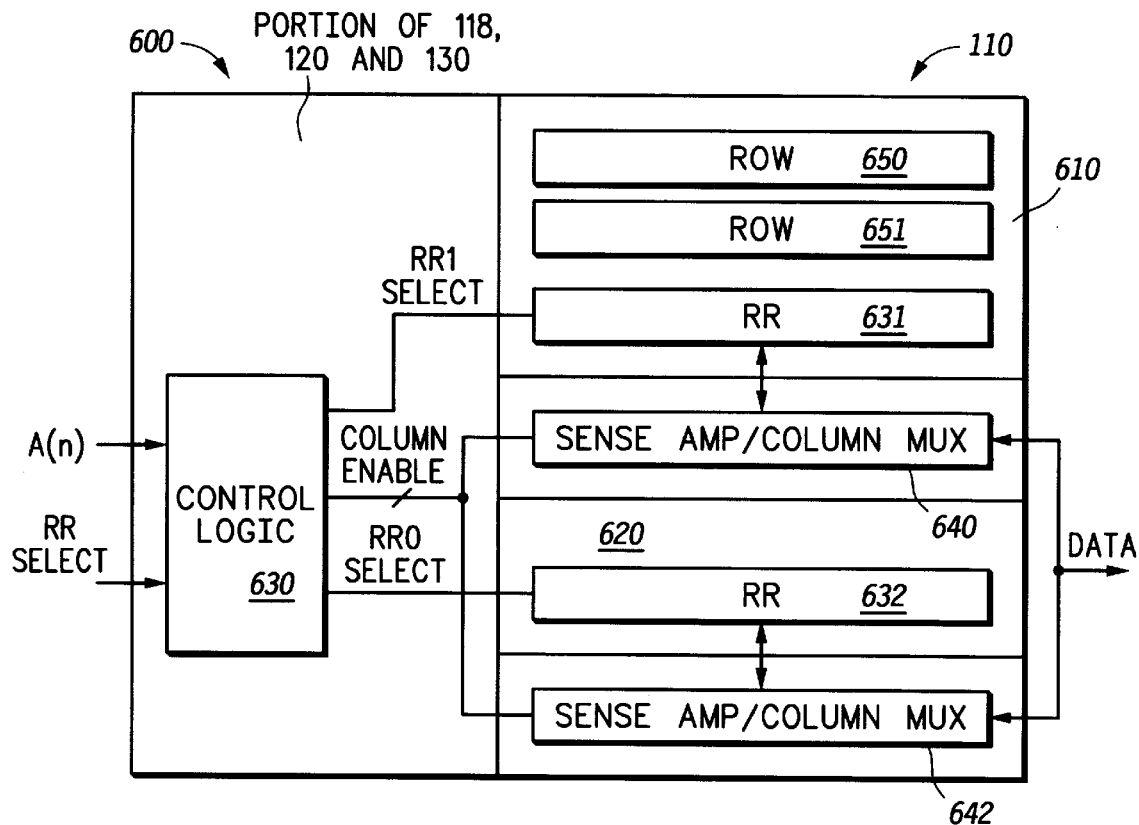
FIG. 5 illustrates a block diagram with two banks of memory.

Shown in FIG. 5 is a specific embodiment, wherein memory cells 110 comprises a first memory bank 610 and a second memory bank 620. Portion 600 also comprises a portion of block 118, column decoder 130 and redundant row decoder 120. Specifically, portion 600 comprises logic control circuitry 630. The logic control circuitry 630 receives an RRSELECT signal indicating when an associated redundant row is to be selected. In addition, address A(n), which is the address being accessed within memory cells 110, is input into control logic circuitry 630. In this embodiment of the invention, a redundant row within one bank of memory can be used to replace a defective row in a second bank of memory.

Specifically, redundant row 632 in memory bank 620 may be used to replace row 651 within memory bank 610 if it is defective, and redundant row 631 may be used to replaced row 650 within memory bank 610 if it is defective. For example, in one embodiment if row 650 within memory 610 is defective, then RRSELECT would indicate that a signal RR1SELECT should be provided by the control logic 630 which selects redundant row 631. In addition, control logic 630 selects column MUX 640 to output data on the DATA line while disabling MUX 642. Similarly, if row 651 within bank 610 is defective and being replaced by redundant row 632 in memory bank 620, then control logic circuitry 630 generates a signal RR0SELECT which selects redundant row 632. In addition, control logic circuitry 630 selects column MUX 642 to output data on the DATA line and also disables column MUX 640. Thus if a redundant row within one memory bank is being used to replace a defective row lying within a second memory bank, only one column MUX is selected. Note, in this embodiment the sense amplifiers 640 and 642 can be selected separately by control logic 630.

Figure 6:
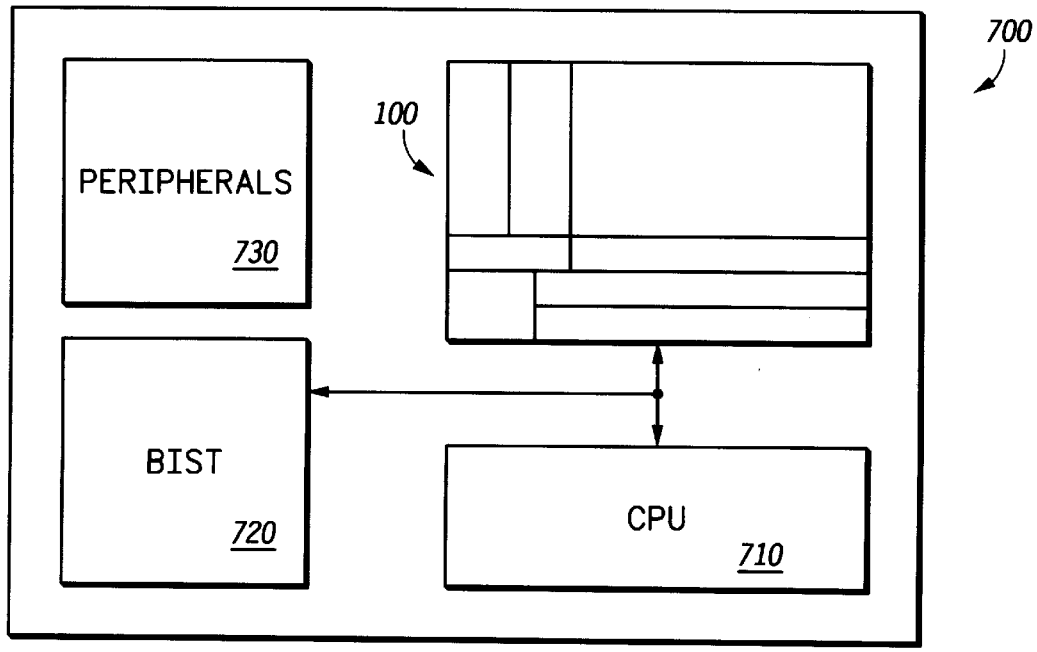
FIG. 6 illustrates a block diagram of a device in accordance with a specific embodiment of the present invention.

FIG. 6 illustrates a semiconductor device 700 comprising the memory array 100 of FIG. 1, a Central Processor Unit (CPU) 710, Peripherals 730, and a Built In Self Test (BIST) 720. The CPU 710 can be any CPU capable of interfacing to a memory array 100 and is not discussed further herein. The BIST 720 is used to perform any self test type functions of the memory array associated with array 100, or any other memory arrays which may be associated with the device 700. Portions of the BIST 720 may actually be performed by the CPU 710. For example, CPU 710 may actually read and write data to the memory array of block 100 to determine if a row of memory is functional or non-functional. BIST technology is known in the industry and is not discussed further herein. The peripherals 730 include any other functions such as input/output controllers, timers, and coprocessors which may additionally reside on the device 700. The device 700 is capable of incorporating the present invention as discussed previously with reference to FIGS. 1 through 5.

In the foregoing specification, the invention has been described with reference to specific embodiments. However, one of ordinary skill in the art appreciates that various modifications and changes can be made without departing from the scope of the present invention as set forth in the claims below. For example, the actual delineation between the blocks of array 110 may vary. Specifically, the Failing Address Latch 118, Row Decoder 116, and Redundant Decoder 120 may reside within a common block, or alternatively the functionality of a specific block as described herein may actually reside within a different portion of the device 100 or even of the device 700. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

What is claimed is:

1. A semiconductor device comprising:
   a memory array having a plurality of rows;
   a built-in self test (BIST) portion for detecting a defective row within the memory array, and having an output node for providing a BIST FAIL signal, wherein the BIST FAIL signal is active for indicating the defective row is detected;
   a first row decoder coupled to the plurality of rows in the memory array;
   circuitry for latching an address of the defective row, the circuitry having an input node for receiving the BIST FAIL signal, wherein the address of the defective row is latched when the BIST FAIL signal is active;
   a plurality of redundant rows;
   a second row decoder coupled to the circuitry for latching and to the plurality of redundant rows; and
   a control circuit coupled to the plurality of redundant rows and to the first row decoder for preventing the first row decoder from enabling the defective row and replacing the defective row with a redundant row.

2. The device of claim 1, further comprising:
   a column node connected to an output of at least one of the plurality of rows and an output of at least one of the plurality of redundant rows.

3. The device of claim 1, further comprising:
   each of the plurality of rows having a bit cell with an output connected to a common column node;
   each of the plurality of redundant rows having a bit cell with an output connected to the common column node.

4. The device of claim 1, wherein:

the control circuit has an output node for providing a disable signal when the defective row is being accessed; and the first row decoder has an input enable node for receiving the disable signal, wherein the row decoder associated with the defective row address is disabled when an active disable signal is received.

5. The device of claim 1, wherein:

each of the plurality of rows has a valid latch having an input for receiving the BIST FAIL signal, wherein the valid latch is for storing an inactive state when the BIST FAIL signal indicates a row failure.

6. The device of claim 1, wherein the memory array is a dynamic random access memory.

7. The device of claim 1, wherein the memory array is a static random access memory.

8. The device of claim 1, wherein the memory array is an electrically erasable programmable read only memory.

9. A semiconductor device comprising:

a memory having a first bank and a second bank;

the first bank of memory comprising:
 a first plurality of rows;
 a first row decoder for selecting one of the first plurality of rows; and
 a first redundant row;

the second memory bank comprising:
 a second plurality of rows;
 a second row decoder for selecting one of the second plurality of rows; and
 a second redundant row;

a built-in self test (BIST) portion having an output for providing an active BIST FAIL signal when a row associated with a row address in one of the first plurality of rows and second plurality of rows is defective;

a control circuit coupled to the BIST portion and to the memory for replacing a defective row in the first plurality of rows with the second redundant row.

10. The semiconductor device of claim 9 wherein:

the first memory bank comprising a first sense amplifier coupled to the first plurality of rows and having a first data output node coupled to a data line; and the second memory bank comprising a second sense amplifier coupled to the second plurality of rows and having a second data output node coupled to the data line.

11. The semiconductor device of claim 9 further comprising:

the control circuit for replacing a defective row in the second plurality of rows with the first redundant row.

12. The semiconductor device of claim 9 further comprising:

the first row decoder having an enable terminal for receiving an enable signal for enabling a decode of the first plurality of rows;

the second row decoder having an enable terminal for receiving the enable signal for enabling a decode of the second plurality of rows;

the control circuit having an enable output terminal coupled to the enable input terminal of the first and second row decoder for providing an inactive enable signal when replacing the defective row with the second redundant row.

13. A semiconductor device comprising:

a memory array having:

a plurality of rows, each of the plurality of rows having a plurality of bit cells having output nodes coupled to a plurality of column nodes;

a row decoder coupled to the plurality of rows for electrically coupling storage nodes associated with one of the plurality of rows to the plurality of column nodes;

a sense amplifier coupled to the plurality of column nodes;

a redundant row having a plurality of redundant bit cells, the plurality of redundant bit cells having output nodes coupled to one of the plurality of column nodes;

a built-in self test (BIST) portion having an input node for receiving a row address and an output node for providing an active signal when a row associated with the row address in the plurality of rows is defective;

a latch having a first input node coupled to the output node of the BIST portion, and a second input node coupled to the row address, an output node coupled to the row decoder and the redundant row for providing a latched address, the latch for latching an address of a defective row.

14. The semiconductor device of claim 13 further comprising:

the row decoder having an enable input terminal for receiving an enable signal for enabling a decode of the plurality of rows;

a control circuit coupled to the output node of the latch and having an enable output terminal coupled to the enable input terminal of the row decoder for providing an inactive enable signal when replacing the defective row with the redundant row, whereby the inactive enable signal prevents the row decoder from electrically coupling storage nodes associated with one of the plurality of rows to the plurality of column nodes.

15. A method of decoding a memory having a plurality of rows, the method comprising:

using built-in self test to identify a non-functional row of the plurality of rows;

storing an address associated with the non-functional row;

monitoring a current address to determine if a match exists between the non-functional address and the current address;

when a match occurs, selecting a redundant row as an active row and disabling selection of the non-functional row;

when a match does not occur, selecting the current row as the active row.

16. The method of claim 15, wherein the memory is a dynamic random access memory.

17. The method of claim 15, wherein the memory is a static random access memory.

18. The method of claim 15, wherein the memory is an electrically erasable programmable read only memory.

19. A method of decoding a memory having a plurality of rows, the method comprising:

using built in self test to identify non-functional rows within the plurality of rows;

for each non-functional row, setting a corresponding latch and storing an address of the non-functional row in volatile memory;

providing the address corresponding to the non-functional row;

preventing the non-functional row from being accessed based on the corresponding latch value;

enabling a redundant row based on the address of the non-functional row.

* * * * *